(12) United States Patent
Tanizaki et al.

(10) Patent No.: US 6,330,202 B1
(45) Date of Patent: Dec. 11, 2001

(54) SEMICONDUCTOR MEMORY DEVICE HAVING WRITE DATA LINE

(75) Inventors: Hiroaki Tanizaki; Tsukasa Ooishi, both of Hyogo (JP)

(73) Assignees: Mitsubishi Denki Kabushiki Kaisha; Mitsubishi Electric Engineering Company Limited, both of Tokyo (JP)

( * ) Notice: Subject to any disclaimer, the term of this patent is extended or adjusted under 35 U.S.C. 154(b) by 0 days.

(21) Appl. No.: 09/706,695

(22) Filed: Nov. 7, 2000

(30) Foreign Application Priority Data

Nov. 12, 1999 (JP) .................................................. 11-322348

(51) Int. Cl.[7] ........................................................ G11C 7/00
(52) U.S. Cl. .................... 365/205; 365/207; 365/189.01; 365/190
(58) Field of Search .................................... 365/205, 207, 365/189.01, 190

(56) References Cited

U.S. PATENT DOCUMENTS 5,488,585 * 1/1996 Kim ...................................... 365/210
6,205,071 * 3/2001 Ooishi .................................. 365/207

FOREIGN PATENT DOCUMENTS 6-302190   10/1994   (JP) .

* cited by examiner

*Primary Examiner*—David Nelms
*Assistant Examiner*—Connie C. Yoha
(74) *Attorney, Agent, or Firm*—McDermott, Will & Emery (57) ABSTRACT

A write control circuit of a DRAM core cell includes a sense amplifier and first to third N channel MOS transistors. The first and third MOS transistors constitute a column selection gate. If data "1" is written, a write mask signal and a data line are set at L level to render the second MOS transistor nonconductive. If data "0" is written, the write mask signal and the data line are set respectively at L and H levels to render the second MOS transistor conductive. In order to inhibit data rewriting, the write mask signal and the data line are both set at H level to render the second and third transistors nonconductive. Layout area and power consumption can be reduced compared with the conventional approach which requires two data lines.

5 Claims, 10 Drawing Sheets

SEMICONDUCTOR MEMORY DEVICE HAVING WRITE DATA LINE

BACKGROUND OF THE INVENTION

1. Field of the Invention

The present invention relates to semiconductor memory devices, and particularly to a data-rewritable semiconductor memory device.

2. Description of the Background Art

A system LSI has been developed having a DRAM core cell merged with a logic circuit. In order to enhance data transfer rate, simultaneous input/output of several hundred-bit data is possible between the DRAM core cell and the logic circuit. An input terminal for an 1-bit write mask signal is provided per a predetermined number of bits. This write mask signal can be controlled to inhibit data rewriting of corresponding memory cells.

Figure 6:
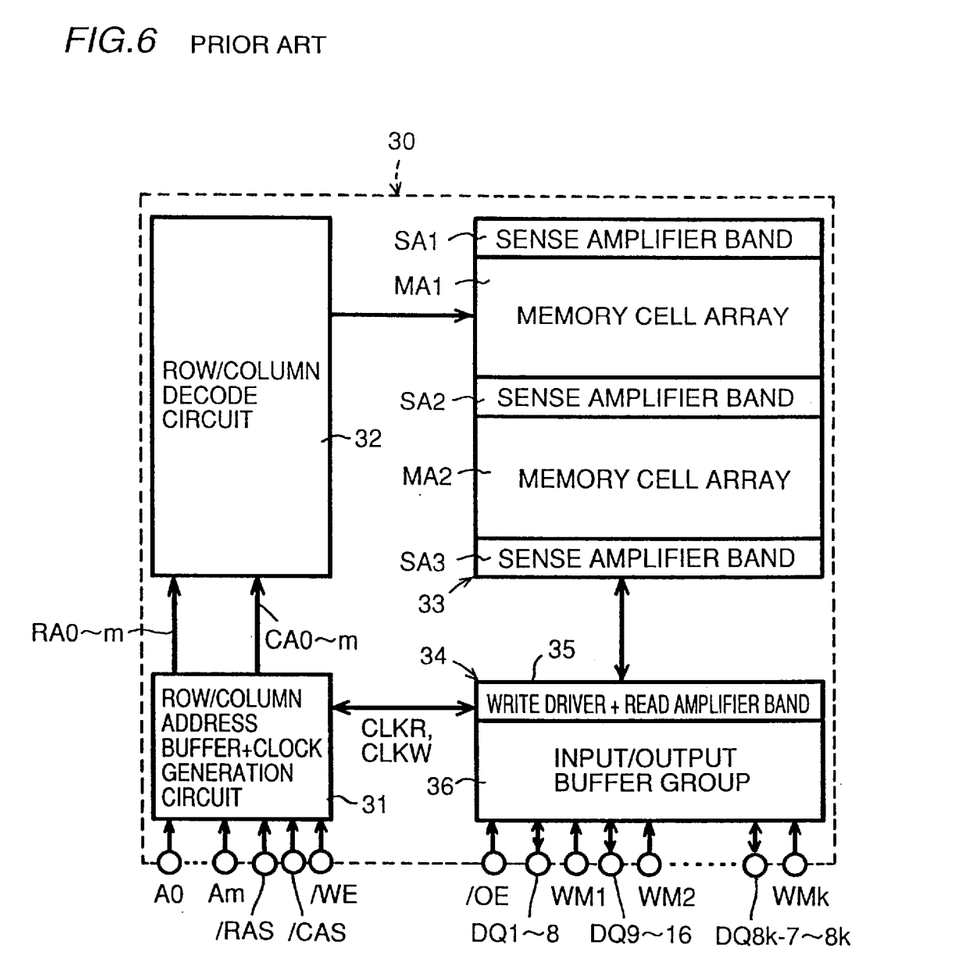
FIG. 6 is a block diagram showing a whole structure of a conventional DRAM core cell.

FIG. 6 is a block diagram showing an overall structure of such a DRAM core cell 30. Referring to FIG. 6, DRAM core cell 30 includes a row/column address buffer+clock generation circuit 31, a row/column decode circuit 32, a memory mat 33 and a data input/output circuit 34. In this DRAM core cell 30, 8k-bit (k is an integer of at least 1) data DQ1–DQ8k can be input/output simultaneously. An input terminal for 1-bit write mask signal WM is provided per 8-bit data.

Row/column address buffer+clock generation circuit 31 generates row address signals RA0–RAm, column address signals CA0–CAm, read clock signal CLKR, write clock signal CLKW and the like according to external address signals A0–Am (m is an integer of at least 0) and external control signals /RAS, /CAS and /WE to control the whole DRAM core cell 30.

Memory mat 33 includes a plurality of (three in FIG. 1) sense amplifier bands SA1–SA3 and memory arrays MA1 and MA2 each provided between the sense amplifier bands. Memory array MA1 and MA2 include a plurality of memory cells each for storing 1-bit data. The memory cells are divided into groups each including a predetermined number 8k of memory cells. Each memory cell group is located at a predetermined address determined by a row address and a column address.

Row/column decode circuit 32 designates addresses of memory arrays MA1 and MA2 according to row address signals RA0–RAm and column address signals CA0–CAm supplied from row/column address buffer+clock generation circuit 31. In sense amplifier bands SA1 and SA2, a sense amplifier+input/output control circuit group described later is provided. The sense amplifier+input/output control circuit group connects 8k memory cells at an address designated by row/column decode circuit 32 to data input/output circuit 34. Data input/output circuit 34 includes a write driver+read amplifier band 35 and an input/output buffer group 36. A write driver group and a read amplifier group are provided in write driver+read amplifier band 35.

The read amplifier group operates synchronously with read clock signal CLKR to supply read data Q1–Q8k from 8k memory cells to input/output buffer group 36. Input/output buffer group 36 responds to external control signal /OE to output read data Q1–Q8k from the read amplfier group to the outside. The write driver group operates synchronously with write clock signal CLKW to write externally supplied write data D1–D8k into selected 8k memory cells. However, no data is written into memory cells among 8k memory cells that are designated by any write mask signals WM1–WMk.

Figure 7:
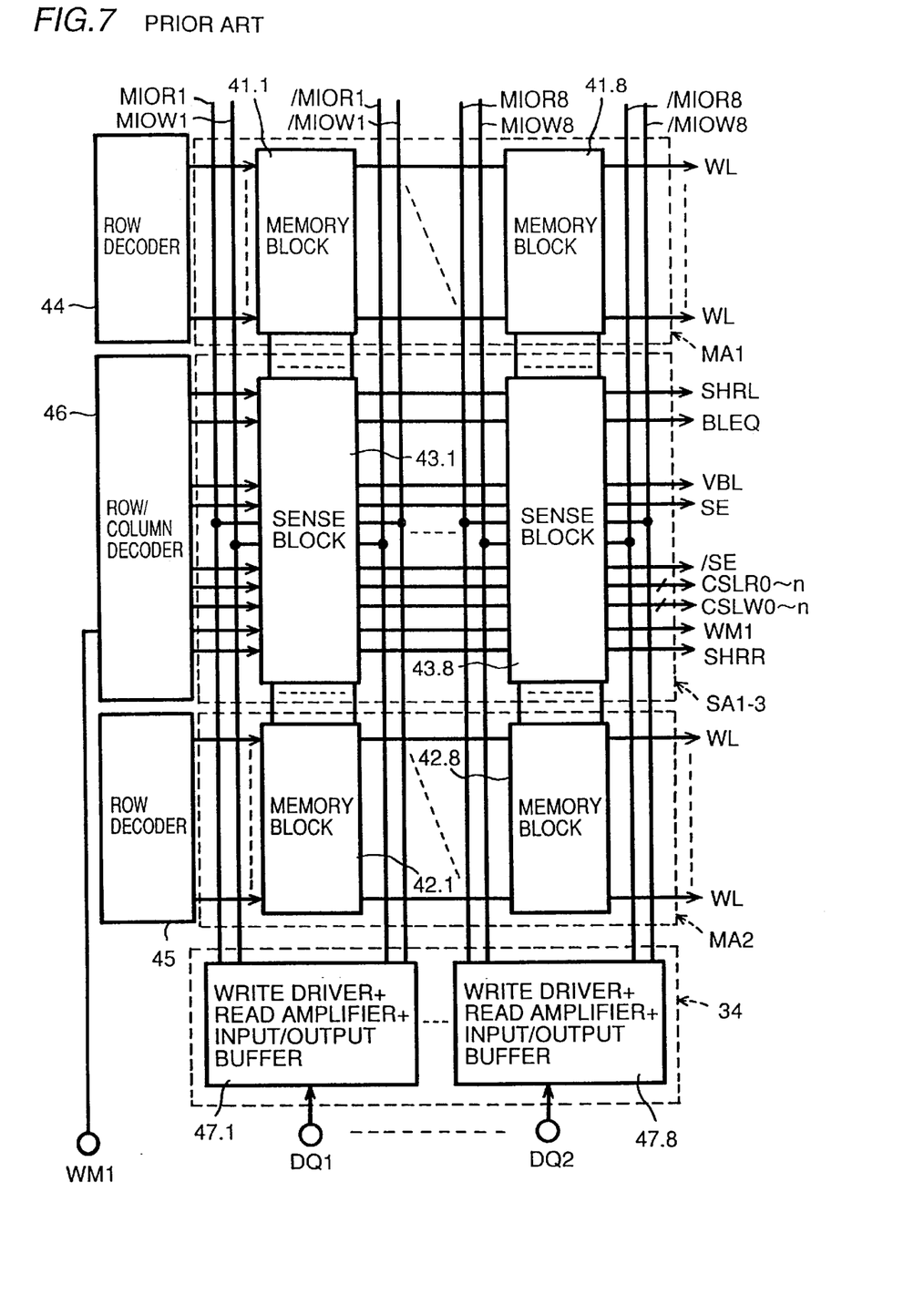
FIG. 7 is a block diagram showing a major part of the DRAM core cell in FIG. 6.

FIG. 7 is a block diagram showing a major part of DRAM core cell 30 in FIG. 6. For the purpose of simplifying the drawing and description, discussion is presented regarding 8-bit data DQ1–DQ8 and write mask signal WM1 only.

Referring to FIG. 7, memory array MA1 includes 8 memory blocks 41.1–41.8, memory array MA2 includes 8 memory blocks 42.1–42.8, and 8 sense blocks 43.1–43.8 are provided to sense amplifier bands SA1–SA3. Although sense blocks 43.1–43.8 are actually dispersed over three sense amplifier bands SA1–SA3, FIG. 7 shows the sense blocks collectively placed between memory arrays MA1 and MA2 for simplifying the drawing and description.

Figure 8:
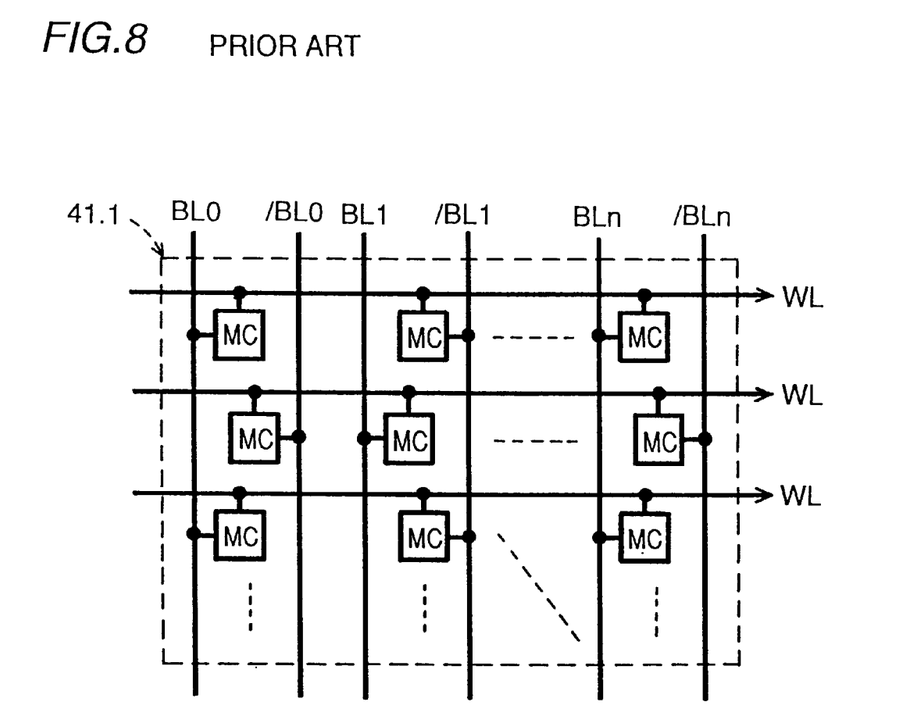
FIG. 8 is a block diagram showing a structure of a memory block in FIG. 7.

Referring to FIG. 8, memory block 41.1 includes a plurality of memory cells MC arranged in a matrix of a plurality of rows and n+1 (n is an integer of at least 1) columns, a plurality of word lines WL provided correspondingly to respective rows, and n+1 pairs of bit lines BL0,/BL0, . . . BLn, /BLn provided correspondingly to respective n+1 columns. Memory cell MC is a well-known memory cell including an N channel MOS transistor for access and a capacitor for information storage.

When word line WL is set at "H" level which is selection level, memory cell MC at a row corresponding to the word line WL is activated. Then, data can be written/read to/from the memory cell MC. In a write operation, one word line WL is set at the selection H level to activate memory cell MC, and thereafter one of paired bit lines is set at H level while the other bit line is set at "L" level according to write data D. In this way, potential on the bit line is written into desired memory cell MC. In a read operation, potential on paired bit lines BL, /BL is equalized to VBL (=VCC/2), and thereafter one word line WL is set at the selection H level to activate memory cell MC. Accordingly, a slight potential difference according to data stored in memory cell MC is generated between each pair of bit lines BL and /BL. This slight potential difference between bit lines of each pair is amplified to supply voltage VCC and then the potential difference between a pair of bit lines is detected to read data from desired memory cell MC. Other memory blocks 41.2–41.8 and 42.1–42.8 each have the same configuration as that of memory block 41.1. Word lines WL are commonly provided to memory blocks 41.1–41.8 and 42.1–42.8.

Row decoders 44 and 45 are provided correspondingly to respective memory arrays MA1 and MA2. Row decoders 44 and 45 select any of word lines WL included in respective memory arrays MA1 and MA2 according to row address signals RA0–RAm to set the selected word line WL at the selection H level.

A row/column decoder 46 is provided correspondingly to sense blocks 43.1–43.8. Further, correspondingly to sense blocks 43.1–43.8 respectively, read data lines MIOR1, /MIOR1, . . . MIOR8, /MIOR8, write data lines MIOW1, /MIOW1, . . . MIOW8, /MIOW8, and write driver+read amplifier+input/output buffers 47.1–47.8 are provided. Row decoders 44 and 45 and row/column decoder 46 are included in row/column decode circuit 32 and write driver+read amplifier+input/output buffers 47.1—47.8 are included in data input/output circuit 34.

Row/column decoder 46 generates various internal signals SHRL, SHRR, BLEQ, VBL, SE, /SE, CSLR0–CSLRn, CSLW0–CSLWn, and WM1 according to row address signals RA0–RAm, column address signals CA0–CAm and write mask signal WM1 to control sense blocks 43.1–43.8.

Sense blocks 43.1–43.8 are coupled to memory blocks 41.1–41.8 when signal SHRL is set at "H" level which is activation level, and coupled to memory blocks 42.1–42.8 when signal SHRR is set at the activation H level. Sense blocks 43.1–43.8 equalize, to bit line potential VBL, potential on each pair of bit lines BL and /BL of memory blocks 41.1–41.8 and 42.1–42.8 when signal BLEQ is at the activation H level.

In response to signals SE and /SE set at the activation H level and "L" level respectively, sense blocks 43.1–43.8 amplify a slight potential difference generated between paired bit lines BL and /BL to supply voltage VCC. Further, sense blocks 43.1–43.8 each select one pair of bit lines from n+1 pairs of bit lines BL0, /BL0, . . . BLn, /BLn included in a connected memory block according to signals CSLR0–CSLRn to connect the selected bit line pair to a corresponding pair of read data lines MIOR and /MIOR.

Sense blocks 43.1–43.8 are each activated when write mask signal WM1 is at H level to select one pair of bit lines from n+1 pairs of bit lines BL0, /BL0, . . . BLn, /BLn included in a connected memory block according to signals CSLW0–CSLWn and connect the selected bit line pair to a corresponding pair of write data lines MIOW and /MIOW.

Write driver+read amplifier+input/output buffers 47.1–47.8 are connected to respective ends of write data lines MIOW1, /MIOW1, . . . MIOW8, /MIOW8 and read data lines MIOR1, /MIOR1, . . . MIOR8, /MIOR8 to write/read data DQ1–DQ8.

Figure 9:
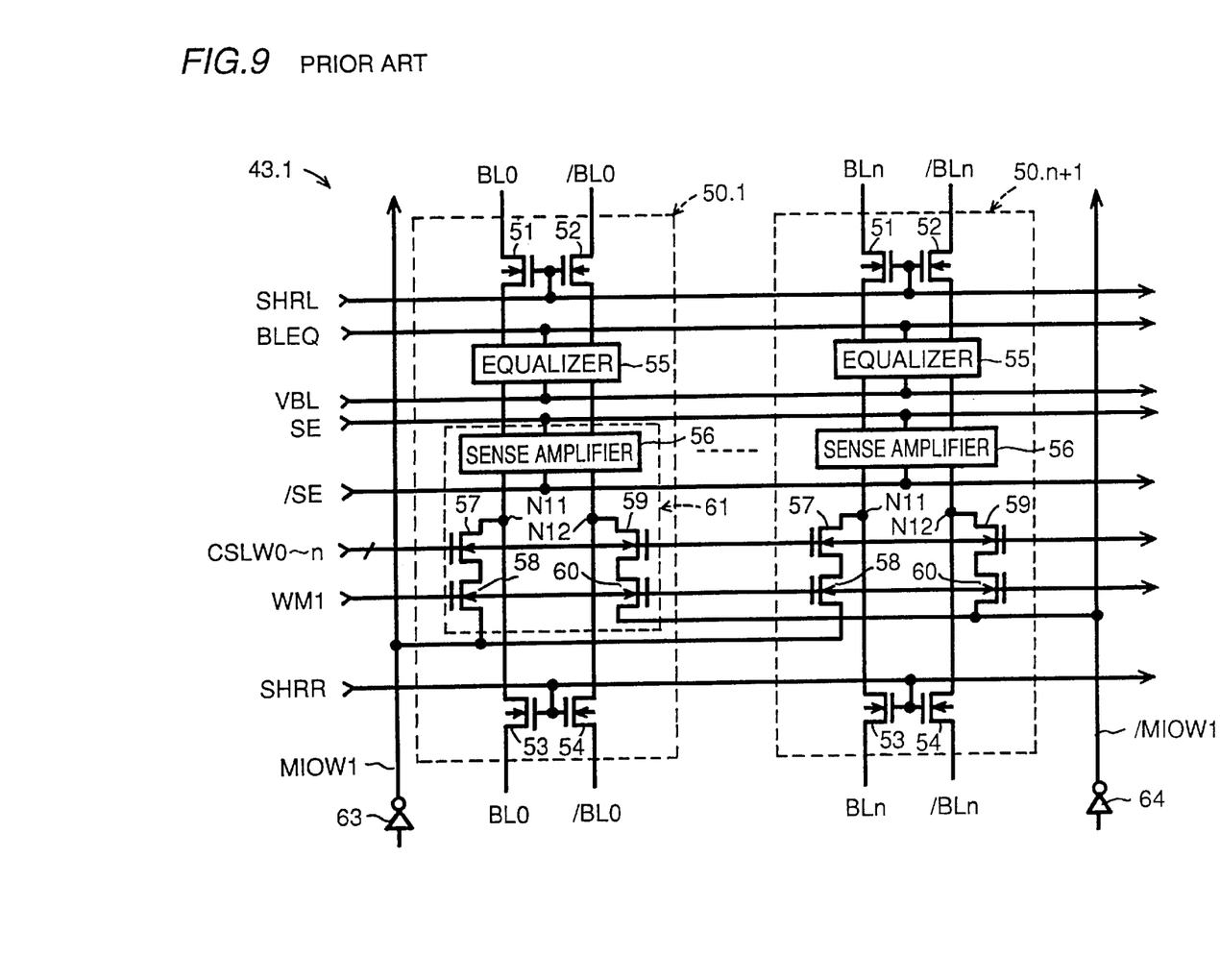
FIG. 9 is a circuit block diagram showing a structure of a sense block in FIG. 7.

FIG. 9 is a circuit block diagram showing a part of sense block 43.1 that is associated with data writing. Referring to FIG. 9, sense block 43.1 includes n+1 sense amplifier+input/output control circuits 50.1–50.n+1. Sense amplifier+input/output control circuits 50.1–50.n+1 are shared by respective pairs of bit lines BL0, /BL0 . . . BLn, /BLn in memory blocks 41.1 and 42.1.

Sense amplifier+input/output control circuit 50.1 includes N channel MOS transistors 51–54, an equalizer 55, a sense amplifier 56, and N channel MOS transistors 57–60. N channel MOS transistors 51 and 52 are connected respectively between bit lines BL0 and /BL0 of memory block 41.1 and nodes N11 and N12 and each have the gate receiving signal SHRL. N channel MOS transistors 53 and 54 are connected respectively between bit lines BL0 and /BL0 of memory block 42.1 and nodes N11 and N12 and each have the gate receiving signal SHRR. When signal SHRL is set at the activation H level, N channel MOS transistors 51 and 52 become conductive to couple sense amplifier+input/output control circuit 50.1 to the pair of bit lines BL0 and /BL0 of memory block 41.1. When signal SHRR is set at the activation H level, N channel MOS transistors 53 and 54 become conductive to couple sense amplifier+input/output control circuit 50.1 to the pair of bit lines BL0 and /BL0 of memory block 42.1.

Equalizer 55 is activated when signal BLEQ is set at the activation H level to equalize potential on paired bit lines BL0 and /BL0 of memory blocks 41.1 and 42.1 to bit line potential VBL via N channel MOS transistors 51–54. Sense amplifier 56 is activated when signals SE and /SE are set respectively at the activation H level and L level to amplify a slight potential difference between paired bit lines BL0 and /BL0 connected to nodes N11 and N12 by N channel MOS transistors 51 and 52 or 53 and 54.

N channel MOS transistors 57 and 58 are connected in series between node N11 and write data line MIOW1 and respective gates receive signals CSLW0 and WM1 respectively. N channel MOS transistors 59 and 60 are connected in series between node N12 and write data line /MIOW1 and respective gates receive signals CSLW0 and WM1 respectively.

When signals CSLW0 and WM1 are both set at the activation H level, N channel MOS transistors 57–60 become conductive and nodes N11 and N12 are connected respectively to write data lines MIOW1 and /MIOW1 via N channel MOS transistors 57, 58 and 59, 60 respectively. When at least one of signals CSLW0 and WM1 is at L level, at least one of N channel MOS transistors 57 and 58 and at least one of N channel MOS transistors 59 and 60 are nonconductive and nodes N11 and N12 are disconnected from write data lines MIOW1 and /MIOW1. Other sense amplifier+input/output control circuits 50.2 to 50.n+1 each have the same structure as that of sense amplifier+input/output control circuit 50.1. It is noted that sense amplifier 56 and N channel MOS transistors 57–60 constitute a write control circuit 61.

Figure 10:
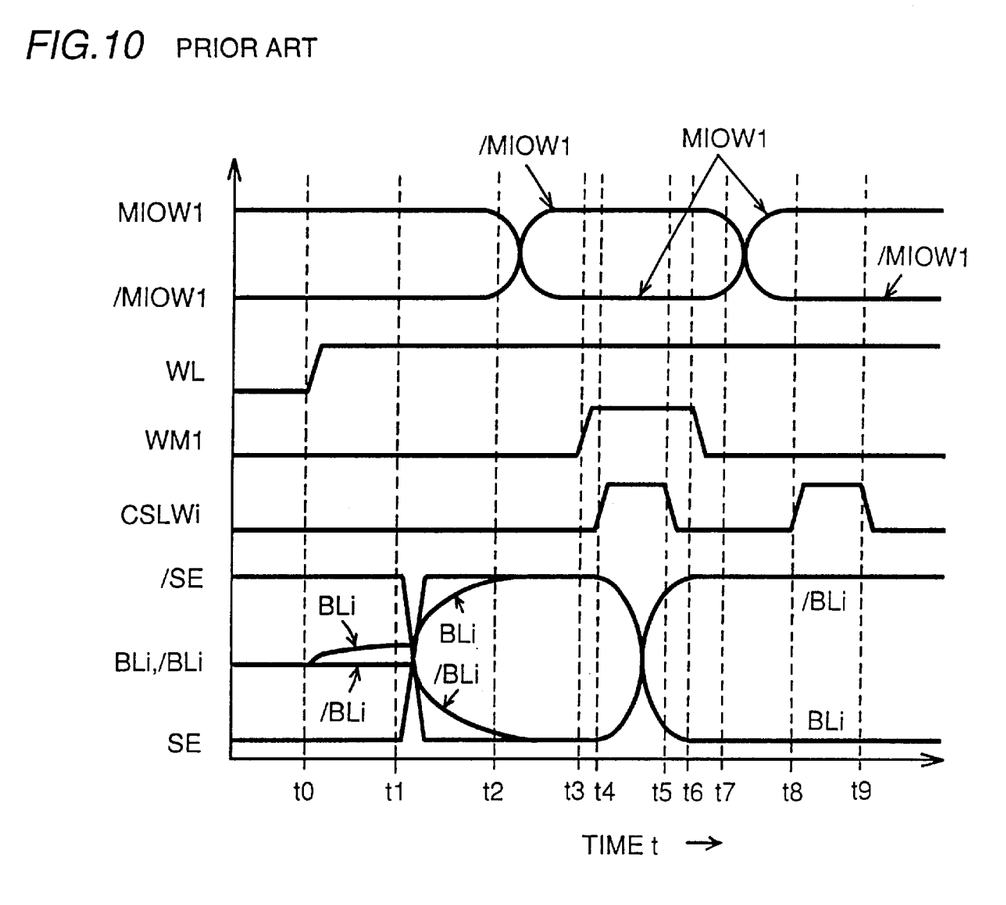
FIG. 10 is a timing chart showing an operation of the DRAM core cell in FIGS. 6 to 9.

FIG. 10 is a timing chart showing a write operation of sense block 43.1 in FIG. 9 In the initial state, paired bit lines BL and /BL of memory blocks 41.1 and 42.1 corresponding to sense block 43.1 are equalized to bit line potential VBL, equalizer 55 is thereafter inactivated, N channel MOS transistors 51 and 52 are conductive, N channel MOS transistors 53 and 54 are nonconductive, and memory block 41.1 and sense block 43.1 are accordingly coupled.

At time t0, one word line WL in memory block 41.1 rises to the selection H level to activate memory cell MC, and a slight potential difference is generated between bit lines BLi and /BLi (i is any of integers 0 to n).

At time t1, signals SE and /SE are set respectively at H and L levels to activate sense amplifier 56 which amplifies the slight potential difference between paired bit lines BLi and /BLi to supply voltage VCC. Here, bit lines BLi and /BLi are set respectively at H and L levels. At this time, data is written again, i.e., data refresh is performed for memory cells MC corresponding to bit line pairs except for the pair of bit lines BLi and /BLi in memory block 41.1.

At time t2, write drivers 63 and 64 set respective write data lines MIOW1 and/MIOW1 at L and H levels respectively. At time t3 and timer t4, signals WM1 and CSLWi successively rise to H level and the levels of write data lines MIOW1 and /MIOW1 are transmitted to paired bit lines BLi and /BLi via N channel MOS transistors 57, 58 and 59, 60 and N channel MOS transistors 51 and 52. The driving power of write drivers 63 and 64 are greater than the driving power of sense amplifier 56. Therefore, the levels of bit lines BLi and /BLi are inverted to L and H levels respectively.

At time t5 and time t6, signals CSLWi and WM1 fall successively to L level, N channel MOS transistors 57–60 become nonconductive, and accordingly data writing is completed. If data writing is not performed in memory block 41.1, write mask signal WM1 is fixed at L level (time t8–t9). In this case, even if signal CSLWi is set at H level to render N channel MOS transistors 57 and 59 conductive, N channel MOS transistors 58 and 60 are nonconductive. Therefore, the pair of write data lines MIOW1 and /MIOW1 and the pair of bit lines BLi and /BLi are not coupled and data rewriting is not conducted for memory cell MC corresponding to the pair of bit lines BLi and /BLi.

As heretofore described, in the conventional DRAM core cell 30, several hundred-bit data can be input/output simultaneously for enhancing data transfer rate. However, there is a problem that four data lines MIOW, /MIOW, MIOR and /MIOR are required per one bit and thus a large layout area is required.

Another problem is that capacitance of data lines MIOW, /MIOW, MIOR and /MIOR is greater and an increased power consumption is necessary for driving them, since data lines MIOW, /MIOW, MIOR and /MIOR are long lines traversing memory mat 33 and the pitch of data lines MIOW, /MIOW, MIOR and /MIOR should be decreased for reducing the layout area.

SUMMARY OF THE INVENTION

One object of the present invention is accordingly to provide a semiconductor memory device having smaller layout area and power consumption.

According to one aspect of the invention, a write data line is provided commonly to a plurality of pairs of bit lines, respective first electrodes of first and second transistors are connected to respective ends of two bit lines of each pair to constitute a column selection gate, a first electrode of a third transistor is connected to a second electrode of the first transistor, a second electrode of the second transistor and an input electrode of the third transistor are connected to the write data line, and a write mask signal is supplied to a second electrode of the third transistor. If external data is a first logic, the write mask signal and the write data lines are both set at a first logic level to render the third transistor nonconductive. If external data is a second logic, the write mask signal and the write data line are set respectively at first and second logic levels to render the third transistor conductive. If writing of external data is not performed, the write mask signal and the write data line are both set at the second logic level to render the second and third transistors nonconductive. Since only one write data line is used here, the layout area and power consumption can be reduced compared with the conventional device which needs two write data lines.

Preferably, the write mask signal is fixed at the first logic level. In this case, write mask control is impossible-However, no line for the write mask signal is needed and accordingly the layout area and power consumption are further reduced.

According to another aspect of the invention, a write data line is provided commonly to a plurality of pairs of bit lines, respective first electrodes of first and second transistors are connected to respective ends of two bit lines of each pair to constitute a column selection gate, respective first electrodes of third and fourth transistors are connected to respective second electrodes of first and second transistors, an input electrode of the third transistor and a second electrode of the fourth transistor are both connected to the write data line, and a second electrode of the third transistor and an input electrode of the fourth transistor are provided respectively with a first logic level and a write mask signal. If external data is a first logic, the write mask signal and the write data line are respectively set at second and first logic levels to render the third transistor nonconductive and render the fourth transistor conductive. If external data is a second logic, both of the write mask signal and the write data line are set at the second logic level to render the third and fourth transistors conductive. If writing of external data is not performed, both of the write mask signal and the write data line are set at the first logic level to render the third and fourth transistors nonconductive. Since only one write data line is used here, the layout area and power consumption can be reduced compared with the conventional device which needs two write data lines.

According to a further aspect of the invention, first and second write data lines are provided commonly to a plurality of pairs of bit lines, respective first electrodes of first and second transistors are connected to respective ends of two bit lines of each pair to constitute a column selection gate, third and fourth transistors are connected respectively between respective second electrodes of first and second transistors and a line of a first logic level, and respective input electrodes of third and fourth transistors are connected to the first and second write data lines respectively. If external data is a first logic, first and second write data lines are set at first and second logic levels respectively to render the third transistor nonconductive and render the fourth transistor conductive. If external data is a second logic, the first and second write data lines are set respectively at second and first logic levels to render the third transistor conductive and render the fourth transistor nonconductive. If writing of external data is not conducted, both of the first and second write data lines are set at the first logic level to render both of the third and fourth transistors nonconductive. No line is necessary for write mask signal, and the layout area and power consumption can thus be reduced.

Preferably, fifth and sixth transistors are further provided. The fifth and sixth transistors are provided correspondingly to third and fourth transistors respectively, the fifth and sixth transistors having respective first electrodes connected to respective first electrodes of corresponding third and fourth transistors, having respective second electrodes both receiving the second logic level, and having respective input electrodes connected to the second and first write data lines respectively. The fifth and sixth transistors become conductive simultaneously with corresponding fourth and third transistors respectively. In this case, writing of data can further be ensured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
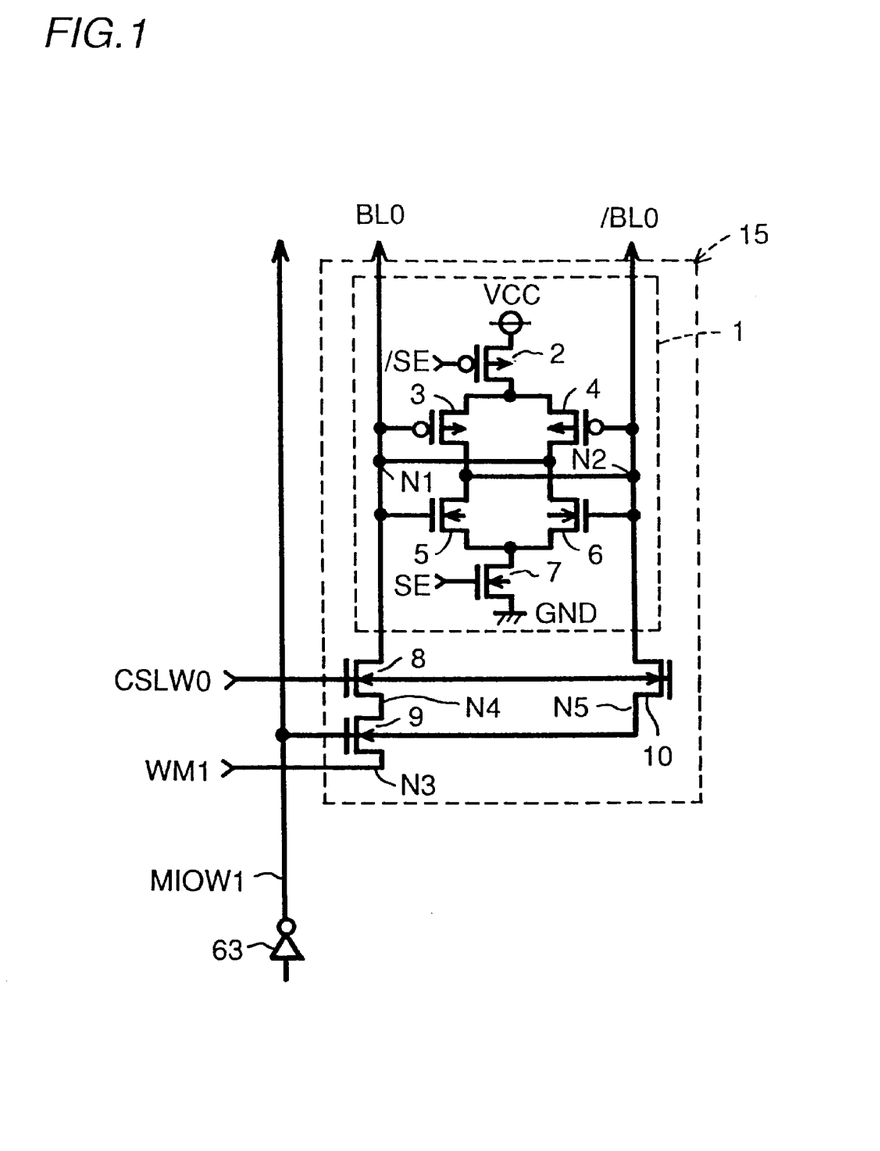
FIG. 1 a circuit diagram showing a structure of a write control circuit of a DRAM core cell according to a first embodiment of the present invention.

FIG. 1 is a circuit diagram showing a structure of a write control circuit 15 of a DRAM core cell according to the first embodiment of the present invention, which is presented for comparison with write control circuit 61 in FIG. 9.

Referring to FIG. 1, write control circuit 15 includes a sense amplifier 1 and N channel MOS transistors 8–10. Sense amplifier 1 includes P channel MOS transistors 2–4 and N channel MOS transistors 5–7. MOS transistors 2, 3, 5 and 7 are connected in series between a line of supply potential VCC and a line of ground potential GND, and MOS transistors 4 and 6 are connected in series between the drain of MOS transistor 2 and the drain of MOS transistor 7. The gates of MOS transistors 2 and 7 receive signals /SE and SE respectively. The gates of MOS transistors 3 and 5 and the drains of MOS transistors 4 and 6 are all connected to a node N1. The gates of MOS transistors 4 and 6 and the drains of MOS transistors 3 and 5 are all connected to a node N2. As shown in FIG. 9, nodes N1 and N2 are connected to paired bit lines BL0 and /BL0 of memory blocks 41.1 and 42.1 via N channel MOS transistors 51, 52 and 53, 54.

N channel MOS transistors 8 and 9 are connected in series between nodes N1 and N3 and N channel MOS transistor 10 is connected between node N2 and the gate of N channel MOS transistor 9. The gates of N channel MOS transistors 8 and 9 both receive signal CSLW0. The gate of N channel MOS transistor 9 is connected to write data line MIOW1 and write mask signal WM1 is supplied to node N3. Write data line /MIOW1 is not provided.

A method of writing data by using this write control circuit 15 is now described. In the initial state, nodes N1 and N2 are connected to paired bit lines BL0 and /BL0 of memory block 41.1 and equalization for paired bit lines BL0 and /BL0 has been completed.

One word line WL of memory block 41.1 is first set at H level, which is selection level, to activate a memory cell MC. Then, a slight potential difference is generated between paired bit lines BL0 and /BL0, i.e., nodes N1 and N2. Signals /SE and SE are thereafter set at L and H levels respectively to render MOS transistors 2 and 7 conductive and sense amplifier 1 is activated. If potential on node N1 is higher than that on node N2 by a slight amount, MOS transistors 5 and 4 have smaller resistance value than MOS transistors 6 and 3. Then node N1 is set at H level (supply potential VCC) and node N2 is set at L level (ground potential GND). If potential on node N2 is slightly higher than potential on node N1, MOS transistors 6 and 3 have smaller resistance value than MOS transistors 5 and 4. In this case, node N2 is at H level and node N1 is at L level.

If data "1" is written into the selected memory cell MC, that is, paired bit lines BL0 and /BL0 are set at H and L levels respectively, signal WM1 is first set at L level while write data line MIOW1 is set at L level. Accordingly, N channel MOS transistor 9 becomes nonconductive, the drain (node N4) of N channel MOS transistor 8 enters floating state, and the drain (node N5) of N channel MOS transistor 10 is set at L level. Next, signal CSLW0 is set at H level to render N channel MOS transistors 8 and 10 conductive to couple nodes N4 and N1 respectively with nodes N5 and N2. Write driver 63 and sense amplifier 1 accordingly drive nodes N1 and N2, i.e., bit lines BL0 and /BL0 into H and L levels respectively.

If data "0" is written into the selected memory cell MC, i.e., bit lines BL0 and /BL0 are set respectively at L and H levels, signal WM1 is first set at L level while write data line MIOW1 is set at H level. Then, N channel MOS transistor 9 becomes conductive, node N4 is set at L level, and node N5 is set at H level. Next, signal CSLW0 is set at H level to render N channel MOS transistors 8 and 10 conductive and couple nodes N4 and N1 respectively with nodes N5 and N2. Accordingly, write driver 63 and sense amplifier 1 drive nodes N1 and N2, i.e., bit lines BL0 and /BL0 into L and H levels respectively.

If data in the selected memory cell MC is not rewritten, signal WM1 is set at H level while write data line MIOW1 is set at H level. Then, N channel MOS transistors 8 and 10 are nonconductive even if signal CSLW0 is at H level and the levels of nodes N1 and N2 remain unchanged.

As discussed above, only one write data line is used for one sense block in this embodiment. Therefore, compared with the conventional device requiring two write data lines, layout area as well as power consumption for the write operation can be reduced.

Figure 2:
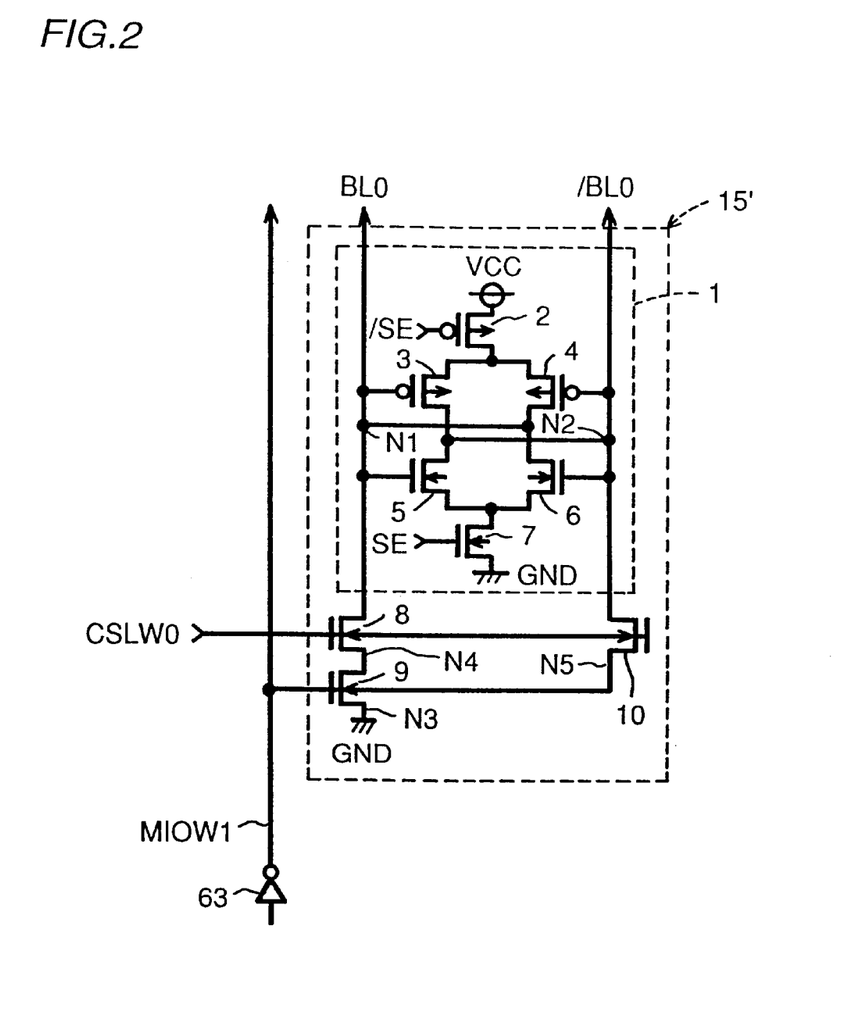
FIG. 2 is a circuit diagram showing a modification of the first embodiment.

If no write mask function is needed, node N3 may be grounded as shown in FIG. 2. Data writing method is the same as that of write control circuit 15 in FIG. 1. Signal CSLW0 may be set at H level after write data line MIOW1 is set at L level if data "1" is written, or after write data line MIOW1 is set at H level if data "0" is written.

Second Embodiment

Figure 3:
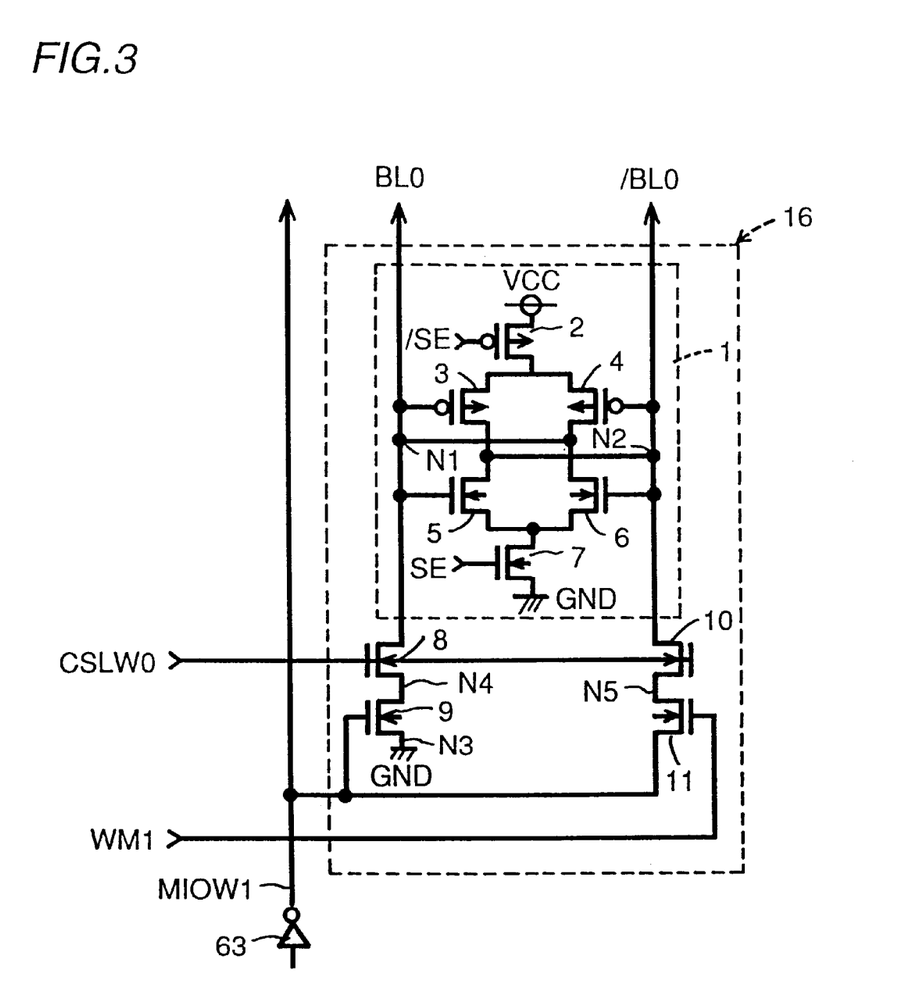
FIG. 3 is a circuit diagram showing a structure of a write control circuit of a DRAM core cell according to a second embodiment of the invention.

FIG. 3 is a circuit diagram showing a structure of a write control circuit 16 of a DRAM core cell according to the second embodiment of the invention. Referring to FIG. 3, write control circuit 16 is different from write control circuit 15 in FIG. 1 in that an N channel MOS transistor 11 is provided between node N5 and write data line MIOW1, signal WM1 is input to the gate of N channel MOS transistor 11, and node N3 is grounded.

A method of writing data by using this write control circuit 16 is now described. If data "1" is written into selected memory cell MC, i.e., bit lines BL0 and /BL0 are set respectively at H and L levels, signal WM1 is first set at H level while write data line MIOW1 is set at L level. Then, N channel MOS transistor 9 becomes nonconductive, node N4 enters floating state, N channel MOS transistor 11 becomes conductive, and node N5 is set at L level. Next, signal CSLW0 is set at H level to render N channel MOS transistors 8 and 10 conductive. Accordingly, write driver 63 and sense amplifier 1 drive nodes N1 and N2, i.e., bit lines BL0 and /BL0 into H and L levels respectively.

If data "0" is written into selected memory cell MC, i.e., bit lines BL0 and /BL0 are set at L and H levels respectively, signal WM1 and write data line MIOW1 are both set at H level. Then, N channel MOS transistors 9 and 11 become conductive and nodes N4 and N5 are set respectively at L and H levels. Next, signal CSLW0 is set at H level to render N channel MOS transistors 8 and 10 conductive. Write driver 63 and sense amplifier 1 thus drive nodes N1 and N2 or bit lines BL0 and /BL0 respectively into L and H levels.

If no data rewriting is conducted for selected memory cell MC, signal WM1 is set at L level while write data line MIOW1 is set at L level. Accordingly, N channel MOS transistors 9 and 11 become nonconductive and nodes N4 and N5 enter floating state. Even if signal CSLW0 is set at H level and N channel MOS transistors 8 and 10 become conductive, the levels of nodes N1 and N2 do not change.

The second embodiment achieves the same effect as that of the first embodiment.

Third Embodiment

Figure 4:
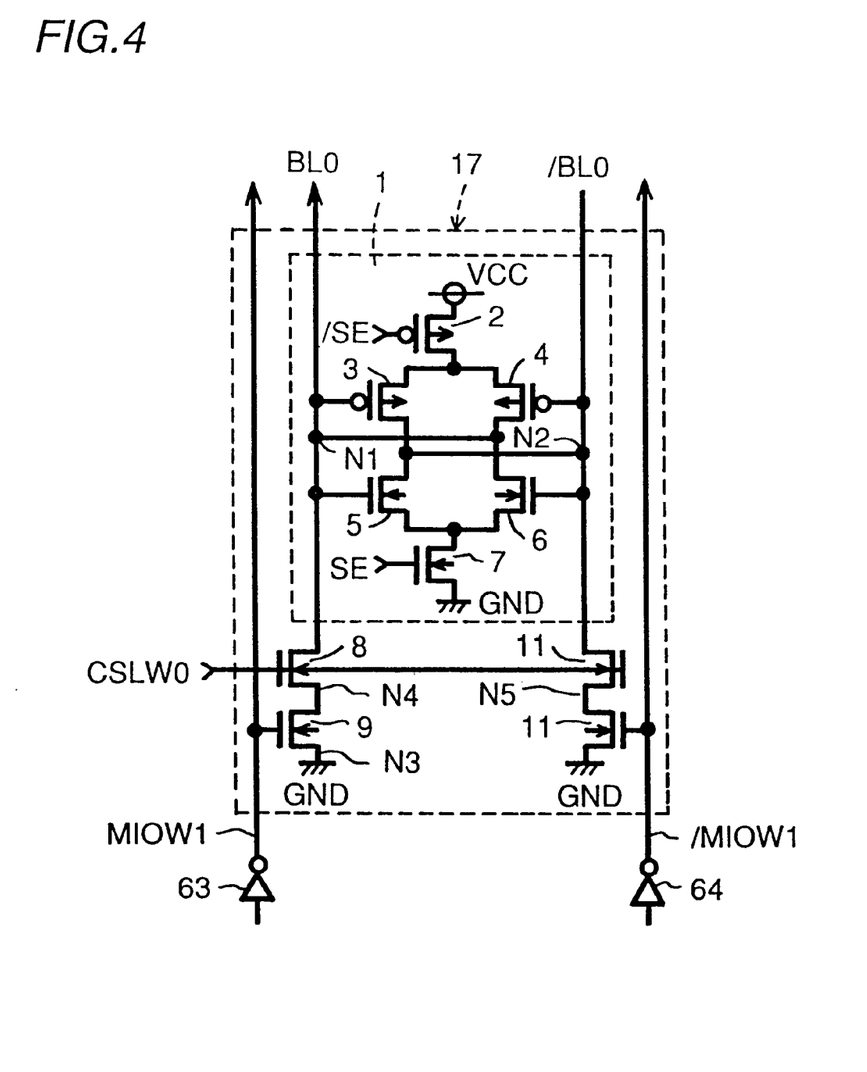
FIG. 4 is a circuit diagram showing a structure of a write control circuit of a DRAM core cell according to a third embodiment of the invention.

FIG. 4 is a circuit diagram showing a structure of a write control circuit 17 of a DRAM core cell according to the third embodiment of the invention. Referring to FIG. 4, write control circuit 17 is different from write control circuit 16 in FIG. 3 in that the gate of N channel MOS transistor 11 does not receive signal MW1, but is connected to write data line /MIOW1 instead, and the drain of N channel MOS transistor 11 is grounded.

A method of writing data by using this write control circuit 17 is now described. if data "1" is written into selected memory cell MC, i.e., paired bit lines BL0 and /BL0 are set respectively at H and L levels, write data lines MIOW1 and MIOW1 are set at L and H levels respectively. Then, N channel MOS transistor 9 becomes nonconductive, node N4 enters floating state, N channel MOS transistor 11 becomes conductive, and node N5 is set at L level. Signal CSLW0 is thereafter set at H level to render N channel MOS transistors 8 and 10 conductive. Accordingly, a sense amplifier 17 drives nodes N1 and N2, i.e., bit lines BL0 and /BL0 into H and L levels respectively.

If data "0" is written into selected memory cell MC, i.e., paired bit lines BL0 and /BL0 are set respectively at L and H levels, write data lines MIOW1 and /MIOW1 are set at H and L levels respectively. Then, N channel MOS transistor 9 becomes conductive, node N4 is set at L level, N channel MOS transistor 11 becomes nonconductive, and node N5 enters floating state. Signal CSLW0 is thereafter set at H level to render N channel MOS transistors 8 and 10 conductive. Accordingly, sense amplifier 17 drives nodes N1 and N2, i.e., bit lines BL0 and /BL0 into L and H levels respectively.

If no data rewriting is performed for selected memory cell MC, write data lines MIOW1 and /MIOW1 are both set at L level. Then, N channel MOS transistors 9 and 11 become nonconductive and nodes N4 and N5 enter floating state. Even if signal CSLW0 is set at H level and N channel MOS transistors 8 and 10 become conductive, the levels of nodes N1 and N2 do not change.

In this embodiment, the line for the write mask signal is unnecessary. Therefore, layout area can be reduced and a regular layout can be realized.

Figure 5:
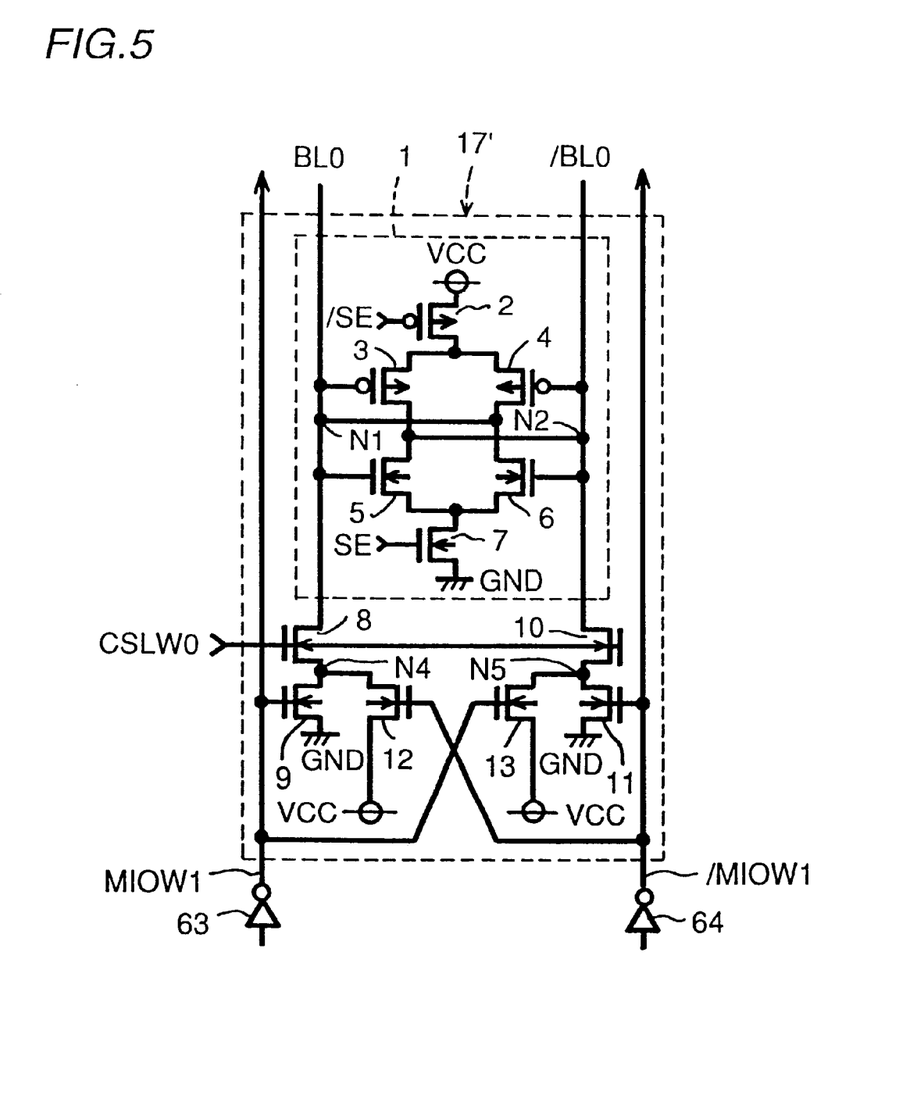
FIG. 5 is a circuit diagram showing a modification of the third embodiment.

N channel MOS transistors 12 and 13 may additionally be provided as shown in FIG. 5. N channel MOS transistors 12 and 13 are connected respectively between nodes N4 and N5 and the line of supply potential VCC. Respective gates are connected to write data lines /MIOW1 and MIOW1 respectively. When write data lines MIOW1 and /MIOW1 are set at L and H levels respectively, MOS transistors 9 and 13 become nonconductive, MOS transistors 12 and 11 become conductive, and nodes N4 and N5 are set at H and L levels respectively. When write data lines MIOW1 and /MIOW1 are set at H and L levels respectively, MOS transistors 12 and 11 become nonconductive, MOS transistors 9 and 13 become conductive, and nodes N4 and N5 are set respectively at L and H levels. If write data lines MIOW1 and /MIOW1 are both set at L level, N channel MOS transistors 9, 11, 12 and 13 become nonconductive and accordingly rewriting of data is inhibited.

Data writing can further be ensured in this case.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A data-rewritable semiconductor memory device comprising:

a memory array including a plurality of memory cells arranged in a matrix of rows and columns, word lines provided correspondingly to respective rows, and pairs of bit lines provided correspondingly to respective columns;

a sense amplifier provided correspondingly to each pair of bit lines to amplify potential difference generated between bit lines of the corresponding bit line pair;

first and second transistors provided correspondingly to each pair of bit lines and having respective first electrodes connected to respective ends of bit lines of the corresponding bit line pair;

a third transistor provided correspondingly to each first transistor and having a first electrode connected to a second electrode of the corresponding first transistor and a second electrode receiving a write mask signal;

a write data line provided commonly to a plurality of said second and third transistors and connected to a second electrode of each second transistor and an input electrode of each third transistor;

a row decoder selecting any of said word lines according to a row address signal to activate each memory cell corresponding to the selected word line;

a column decoder selecting any of said pairs of bit lines according to a column address signal to render conductive the first and second transistors corresponding to the selected pair of bit lines; and a write control circuit writing external data into the memory cell activated by said row decoder via the first and second transistors rendered conductive by said column decoder;

said write control circuit setting both of said write mask signal and said write data line at a first logic level to render said third transistor nonconductive when said external data is a first logic, said write control circuit setting said write mask signal and said write data line at first and second logic levels respectively to render said third transistor conductive when said external data is a second logic, and said write control circuit setting both of said write mask signal and said write data line at the second logic level to render said second and third transistors nonconductive if writing of said external data is not performed.

2. The data-rewritable semiconductor memory device according to claim 1, wherein said write mask signal is fixed at the fist logic level.

3. A data-rewritable semiconductor memory device comprising:

a memory array including a plurality of memory cells arranged in a matrix of rows and columns, word lines provided correspondingly to respective rows, and pairs of bit lines provided correspondingly to respective columns;

a sense amplifier provided correspondingly to each pair of bit lines to amplify potential difference generated between bit lines of the corresponding bit line pair;

first and second transistors provided correspondingly to each pair of bit lines and having respective first electrodes connected to respective ends of bit lines of the corresponding bit line pair;

a third transistor provided correspondingly to each first transistor and having a first electrode connected to a second electrode of the corresponding first transistor and a second electrode receiving a first logic level;

a fourth transistor provided correspondingly to each second transistor and having a first electrode connected to a second electrode of the corresponding second transistor and an input electrode receiving a write mask signal;

a write data line provided commonly to a plurality of said third and fourth transistors and connected to an input electrode of each third transistor and to a second electrode of each fourth transistor;

a row decoder selecting any of said word lines according to a row address signal to activate each memory cell corresponding to the selected word line;

a column decoder selecting any of said pairs of bit lines according to a column address signal to render conductive the first and second transistors corresponding to the selected pair of bit lines; and a write control circuit writing external data into the memory cell activated by said row decoder via the first and second transistors rendered conductive by said column decoder;

said write control circuit setting said write mask signal and said write data line respectively at second and first logic levels to render said third transistor nonconductive and said fourth transistor conductive when said external data is a first logic, said write control circuit setting both of said write mask signal and said write data line at the second logic level to render said third and fourth transistors conductive when said external data is a second logic, setting both of said write mask signal and said write data line at the first logic level to render said third and fourth transistors nonconductive when writing of said external data is not performed.

4. A data-rewritable semiconductor memory device comprising:

a memory array including a plurality of memory cells arranged in a matrix of rows and columns, word lines provided correspondingly to respective rows, and pairs of bit lines provided correspondingly to respective columns;

a sense amplifier provided correspondingly to each pair of bit lines to amplify potential difference generated between bit lines of the corresponding bit line pair;

first and second transistors provided correspondingly to each pair of bit lines and having respective first electrodes connected to respective ends of bit lines of the corresponding bit line pair;

third and fourth transistors provided correspondingly to each first transistor and each second transistor respectively and having respective first electrodes connected to respective second electrodes of the corresponding first and second transistors respectively and having respective second electrodes both receiving a first logic level;

first and second write data lines provided commonly to a plurality of said third and fourth transistors and connected respectively to an input electrode of each third transistor and an input electrode of each fourth transistor;

a row decoder selecting any of said word lines according to a row address signal to activate each memory cell corresponding to the selected word line;

a column decoder selecting any of said pairs of bit lines according to a column address signal to render conductive the first and second transistors corresponding to the selected pair of bit lines; and a write control circuit writing external data into the memory cell activated by said row decoder via the first and second transistors rendered conducive by said column decoder;

said write control circuit setting said first and second write data lines respectively at first and second logic levels to render said third transistor nonconductive and render said fourth transistor conductive when said external data is a first logic, said write control circuit setting said first and second write data lines respectively at second and first logic levels to render said third transistor conductive and render said fourth transistor nonconductive when said external data is a second logic, and said write control circuit setting both of said first and second write data lines at the first logic level to render both of said third and fourth transistors nonconductive when writing of said external data is not performed.

5. The data-rewritable semiconductor memory device according to claim 4, further comprising fifth and sixth transistors provided correspondingly to the third and fourth transistors respectively, having respective first electrodes connected to respective first electrodes of corresponding third and fourth transistors respectively, having respective second electrodes both receiving the second logic level, and having respective input electrodes connected to the second and first write data lines respectively, said fifth and sixth transistors being rendered conductive simultaneously with the corresponding fourth and third transistors respectively.

* * * * *